United States Patent
Chen et al.

(10) Patent No.: US 8,946,084 B2
(45) Date of Patent: Feb. 3, 2015

(54) CONTROLLING THE DEVICE PERFORMANCE BY FORMING A STRESSED BACKSIDE DIELECTRIC LAYER

(71) Applicant: Taiwan Semiconductor Manufacturing Company, Ltd., Hsin-Chu (TW)

(72) Inventors: Ming-Fa Chen, Taichung (TW); I-Ching Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/042,154

(22) Filed: Sep. 30, 2013

(65) Prior Publication Data

US 2014/0295582 A1   Oct. 2, 2014

Related U.S. Application Data

(62) Division of application No. 13/216,843, filed on Aug. 24, 2011, now Pat. No. 8,546,886.

(51) Int. Cl.
*H01L 21/4763* (2006.01)
*H01L 21/66* (2006.01)
*H01L 21/768* (2006.01)

(52) U.S. Cl.
CPC .......... *H01L 22/12* (2013.01); *H01L 21/76898* (2013.01)
USPC ............. 438/667; 257/E21.158; 257/E27.062

(58) Field of Classification Search
CPC ........................... H01L 21/76898; H01L 22/12
USPC .................... 438/667; 257/E21.158, E27.062
See application file for complete search history.

(56) References Cited

U.S. PATENT DOCUMENTS

| | | | |
|---|---|---|---|
| 5,391,917 | A | 2/1995 | Gilmour et al. |
| 5,510,298 | A | 4/1996 | Redwine |

(Continued)

FOREIGN PATENT DOCUMENTS

| | | |
|---|---|---|
| KR | 100809335 | 3/2008 |
| KR | 20090047941 | 5/2009 |

(Continued)

OTHER PUBLICATIONS

Chen, Po-Yuan et al., "On-Chip TSV Testing for 3D IC before Bonding Using Sense Amplification," IEEE Computer Society, Asian Test Symposium, Nov. 2009, pp. 450-455.

(Continued)

*Primary Examiner* — David S Blum
(74) *Attorney, Agent, or Firm* — Slater & Matsil, L.L.P.

(57) ABSTRACT

A device includes a p-type metal-oxide-semiconductor (PMOS) device and an n-type metal-oxide-semiconductor (NMOS) device at a front surface of a semiconductor substrate. A first dielectric layer is disposed on a backside of the semiconductor substrate. The first dielectric layer applies a first stress of a first stress type to the semiconductor substrate, wherein the first dielectric layer is overlying the semiconductor substrate and overlapping a first one of the PMOS device and the NMOS device, and is not overlapping a second one of the PMOS device and the NMOS device. A second dielectric layer is disposed on the backside of the semiconductor substrate. The second dielectric layer applies a second stress to the semiconductor substrate, wherein the second stress is of a second stress type opposite to the first stress type. The second dielectric layer overlaps a second one of the PMOS device and the NMOS device.

17 Claims, 11 Drawing Sheets

(56) References Cited

U.S. PATENT DOCUMENTS

| | | |
|---|---|---|
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,785,951 B2 | 8/2010 | Nam et al. |
| 7,960,282 B2 | 6/2011 | Yelehanka et al. |
| 7,969,013 B2 | 6/2011 | Chen et al. |
| 2007/0166997 A1 | 7/2007 | Knorr |
| 2011/0254092 A1 | 10/2011 | Yang et al. |

FOREIGN PATENT DOCUMENTS

| | | |
|---|---|---|
| KR | 1020090046255 | 5/2009 |
| TW | 201104796 | 2/2011 |

OTHER PUBLICATIONS

Hsieh, C.C. et al., "Orthotropic Stress Field Induced by TSV and Its Impact on Device Performance," Interconnect Technology Conference and 2011 Materials for Advanced Metallization (IITC/MAM) IEEE, May 2011, 3 pages.

ically (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

CONTROLLING THE DEVICE PERFORMANCE BY FORMING A STRESSED BACKSIDE DIELECTRIC LAYER

This application is a divisional of U.S. patent application Ser. No. 13/216,843, now U.S. Pat. No. 8,546,886, filed on Aug. 24, 2011, entitled "Controlling the Device Performance by Forming a Stressed Backside Dielectric Layer," which application is incorporated herein by reference in its entirety.

Since the invention of integrated circuits, the semiconductor industry has experienced continuous rapid growth due to the constant improvement in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3DIC) and stacked dies are commonly used. Through-silicon vias (TSVs) are used in 3DIC and stacked dies. The related process steps are thus explored.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A backside interconnect structure connected to through-substrate vias (TSVs, also sometimes referred to as through-silicon vias) and the method of forming the same are provided. The intermediate stages in the manufacturing of an embodiment are illustrated. The variations of the embodiment are discussed. Throughout the various views and illustrative embodiments, like reference numbers are used to designate like elements.

Figure 1:
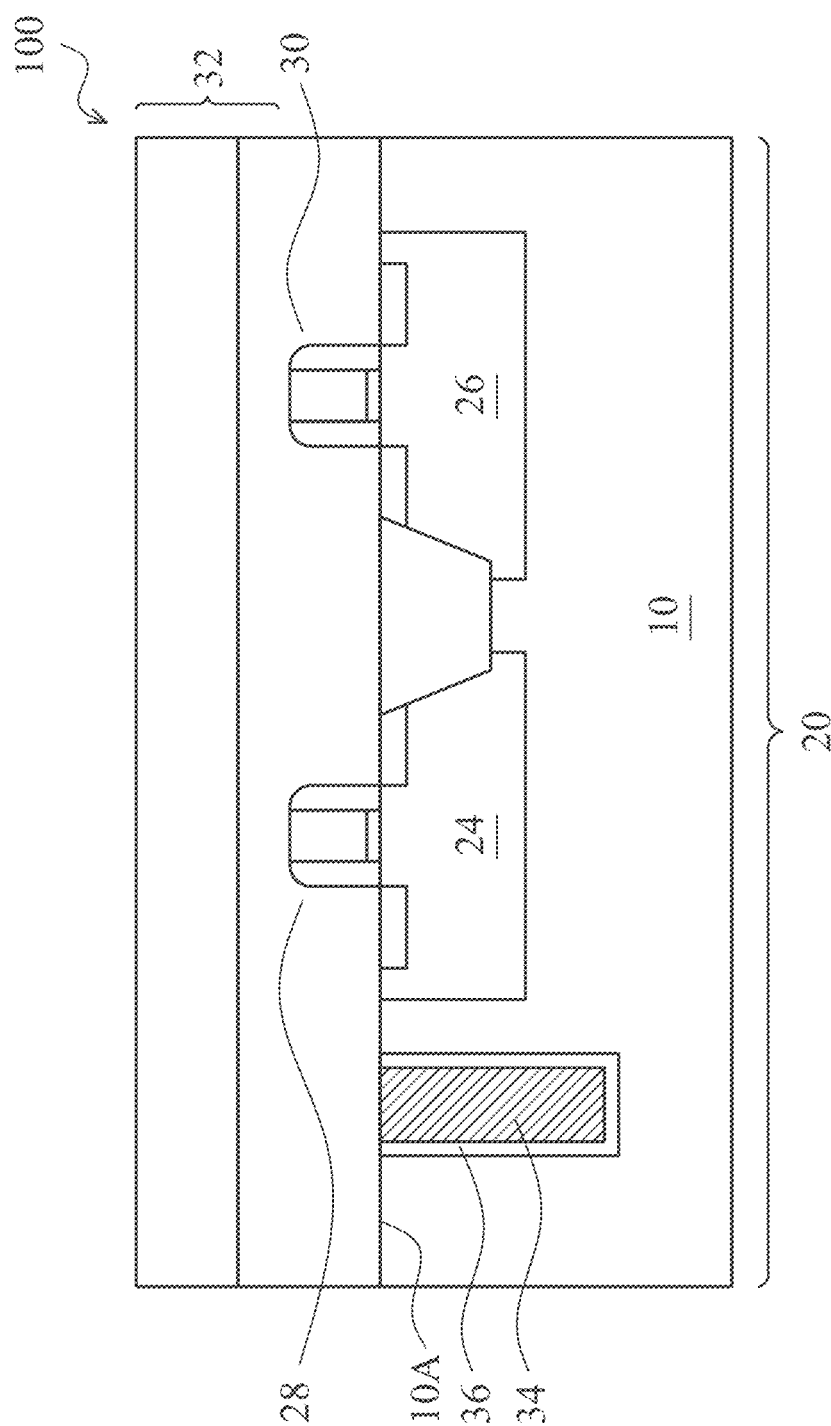
FIGS. 1 through 7 are cross-sectional views of intermediate stages in the manufacturing of a backside interconnect structure in accordance with various embodiments.

Referring to FIG. 1, chip 20, which includes substrate 10, is provided. Chip 20 is in wafer 100, which includes a plurality of chips identical to chip 20. Substrate 10 may be a semiconductor substrate, such as a bulk crystalline silicon substrate, although it may include other semiconductor materials such as germanium, carbon, and the like. Substrate 10 may include n-well region 24 and p-well region 26 therein. Although one n-well region 24 and one p-well region 26 are shown in FIG. 1, the illustrated n-well region 24 may represent all n-well regions in chip 20 (or wafer 100), and the illustrated p-well region 26 may represent all p-well regions in chip 20 (or wafer 100). Alternatively, no p-well region is formed, and the corresponding n-type metal-oxide-semiconductor (NMOS) devices 30 are formed directly on substrate 10, which may be of p-type.

Integrated circuit devices may be formed at front surface 10A of substrate 10. The integrated circuit devices include p-type metal-oxide-semiconductor (PMOS) device 28 and NMOS device 30. Similarly, although one PMOS device 28 and one NMOS device 30 are shown in FIG. 1, the illustrated PMOS device 28 may represent all PMOS devices in chip 20 (or wafer 100), and the illustrated NMOS device 30 may represent all NMOS devices in chip 20 (or wafer 100). Interconnect structure 32, which includes metal lines and vias (not shown) formed therein, is formed over substrate 10 and connected to the integrated circuit devices such as PMOS device 28 and NMOS device 30. The metal lines and vias may be formed of copper or copper alloys, and may be formed using damascene processes. Interconnect structure 32 may include inter-layer dielectric (ILD) and inter-metal dielectrics (IMDs).

TSV 34 is formed in substrate 10, and extends from front surface 10A of substrate 10 into substrate 10. Isolation layer 36 is formed on the sidewalls and at the bottom of TSV 34, and electrically insulates TSV 34 from substrate 10. Isolation layer 36 may be formed of a dielectric material such as silicon nitride, silicon oxide (for example, tetra-ethyl-ortho-silicate (TEOS) oxide), and the like.

Figure 2:
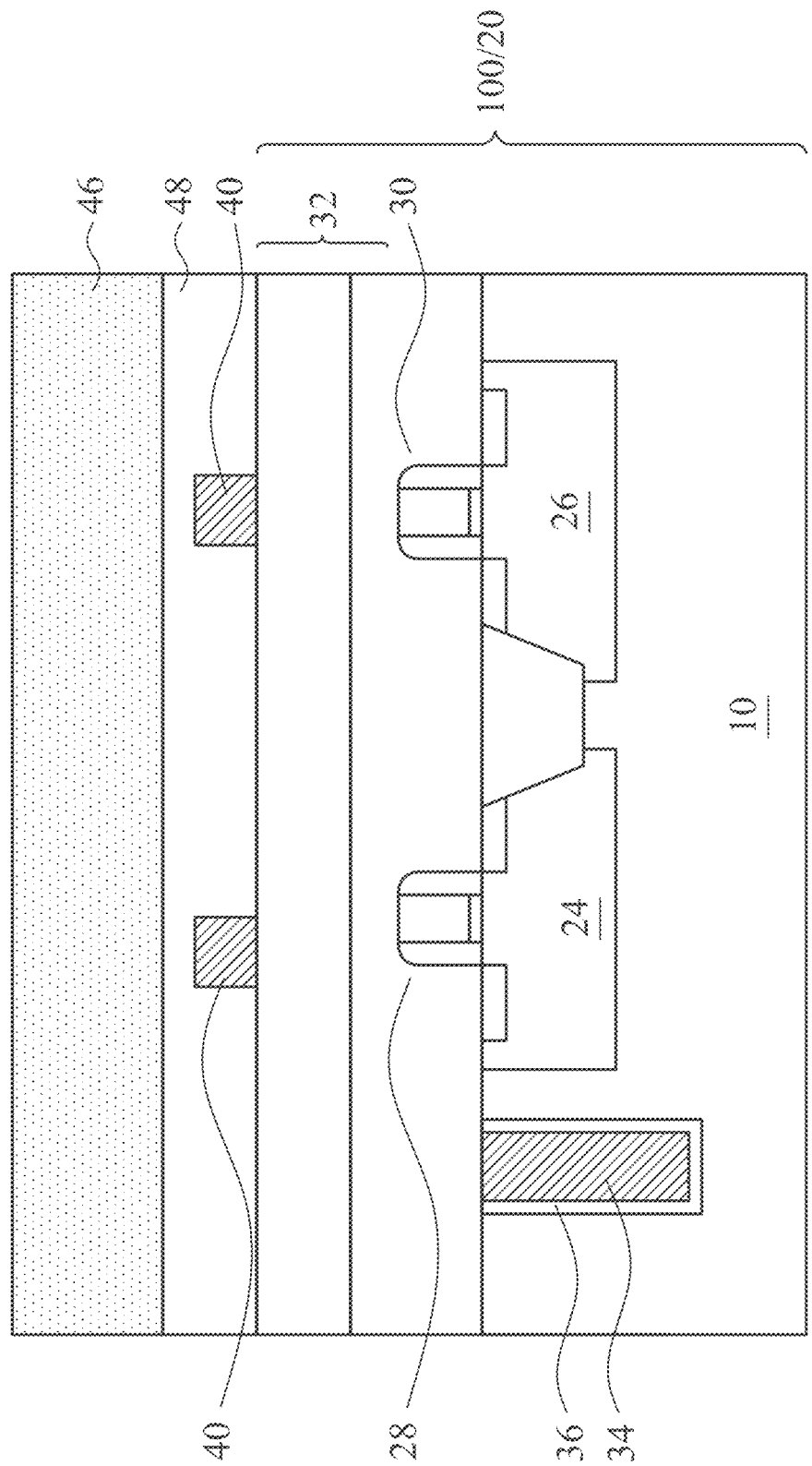
Figure 3:
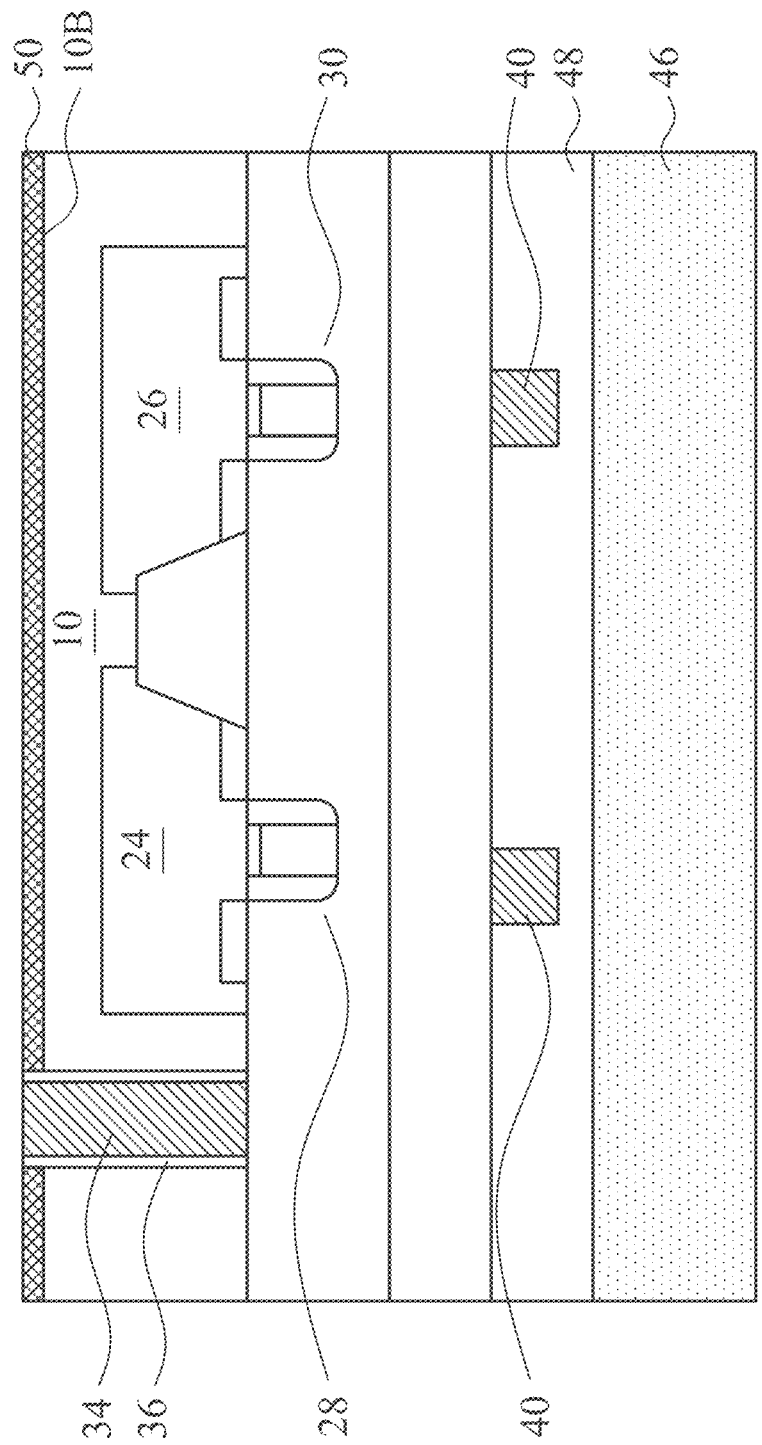

Referring to FIG. 2, metal bump 40 is formed on the front side (the side facing up in FIG. 3) of, and protrudes beyond, the front surface of chip 20. Wafer 100 is then mounted on carrier 46, for example, through adhesive 48. In FIG. 3, a backside grinding is performed to remove excess portion of substrate 10 from the backside of substrate 10, until TSV 34 is exposed. An etch may be performed to further etch the back surface of substrate 10, so that TSV 34 may protrude more out of back surface 10B of substrate 10. Backside isolation layer 50 may be formed to cover back surface 10B of substrate 10. In an exemplary embodiment, the formation of backside isolation layer 50 includes blanket forming backside isolation layer 50, and performing a light chemical mechanical polish (CMP) to remove the portion of backside isolation layer 50 that is directly over TSV 34. Accordingly, TSV 34 is exposed through an opening in backside isolation layer 50. In alternative embodiments, the opening in backside isolation layer 50, through which TSV 34 is exposed, is formed by etching. Backside isolation layer 50 may be formed of a composite layer including a silicon oxide layer and a silicon nitride layer over the oxide layer, for example.

Figure 4:
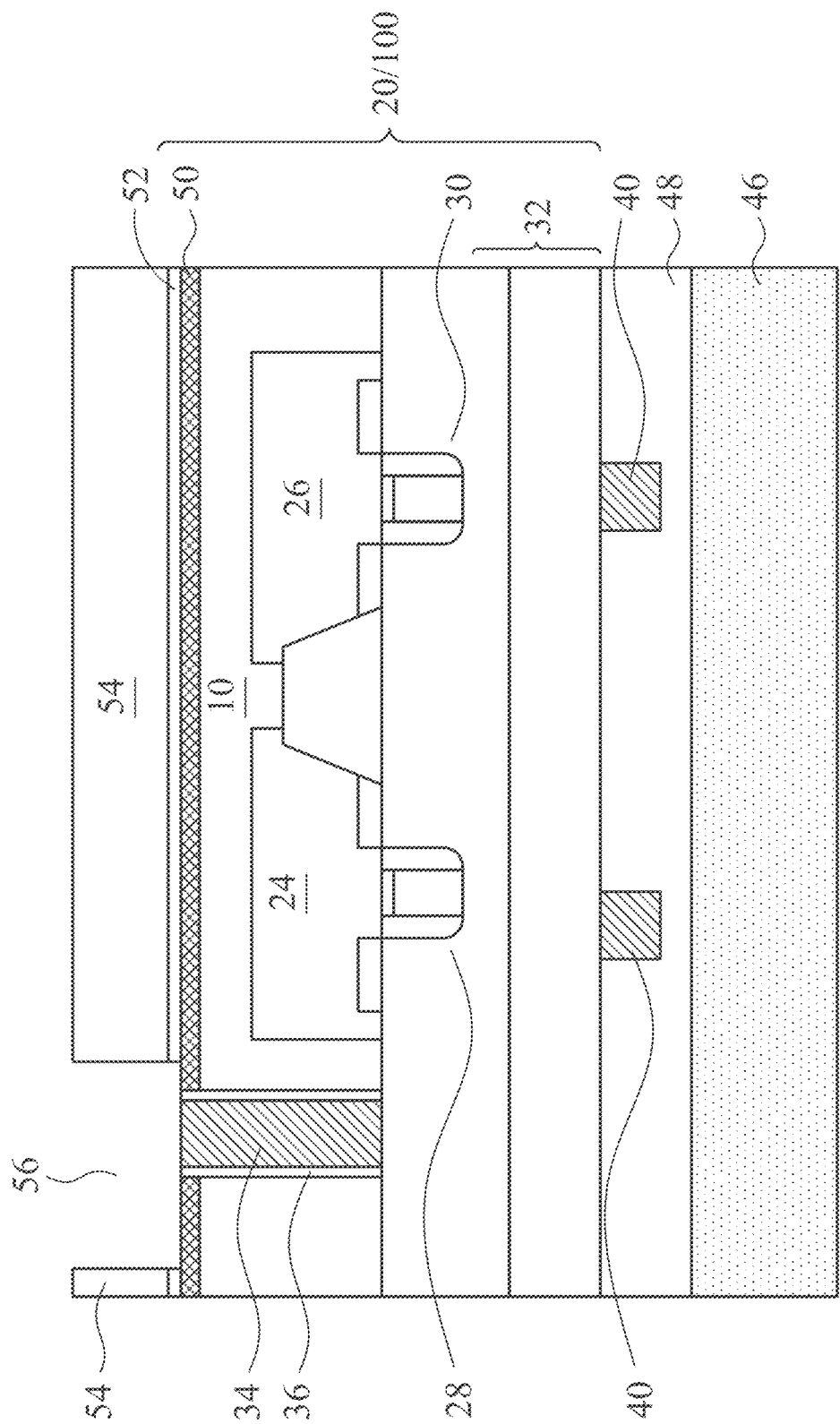

Referring to FIG. 4, seed layer 52, also referred to as an under-bump metallurgy (UBM), is blanket formed on backside isolation layer 50 and TSV 34. The usable materials of UBM 52 include copper or copper alloys. However, other metals such as titanium may be used. UBM 52 may also be formed of a composite layer comprising a titanium layer and a copper layer over the titanium layer. In an embodiment, UBM 52 is formed using sputtering.

FIG. 4 also illustrates the formation of mask 54. In an embodiment, mask 54 is formed of photoresist. Alternatively, mask 54 is formed of a dry film. Mask 54 is then patterned to form opening 56 in mask 54, with TSV 34 being directly under opening 56.

Figure 5:
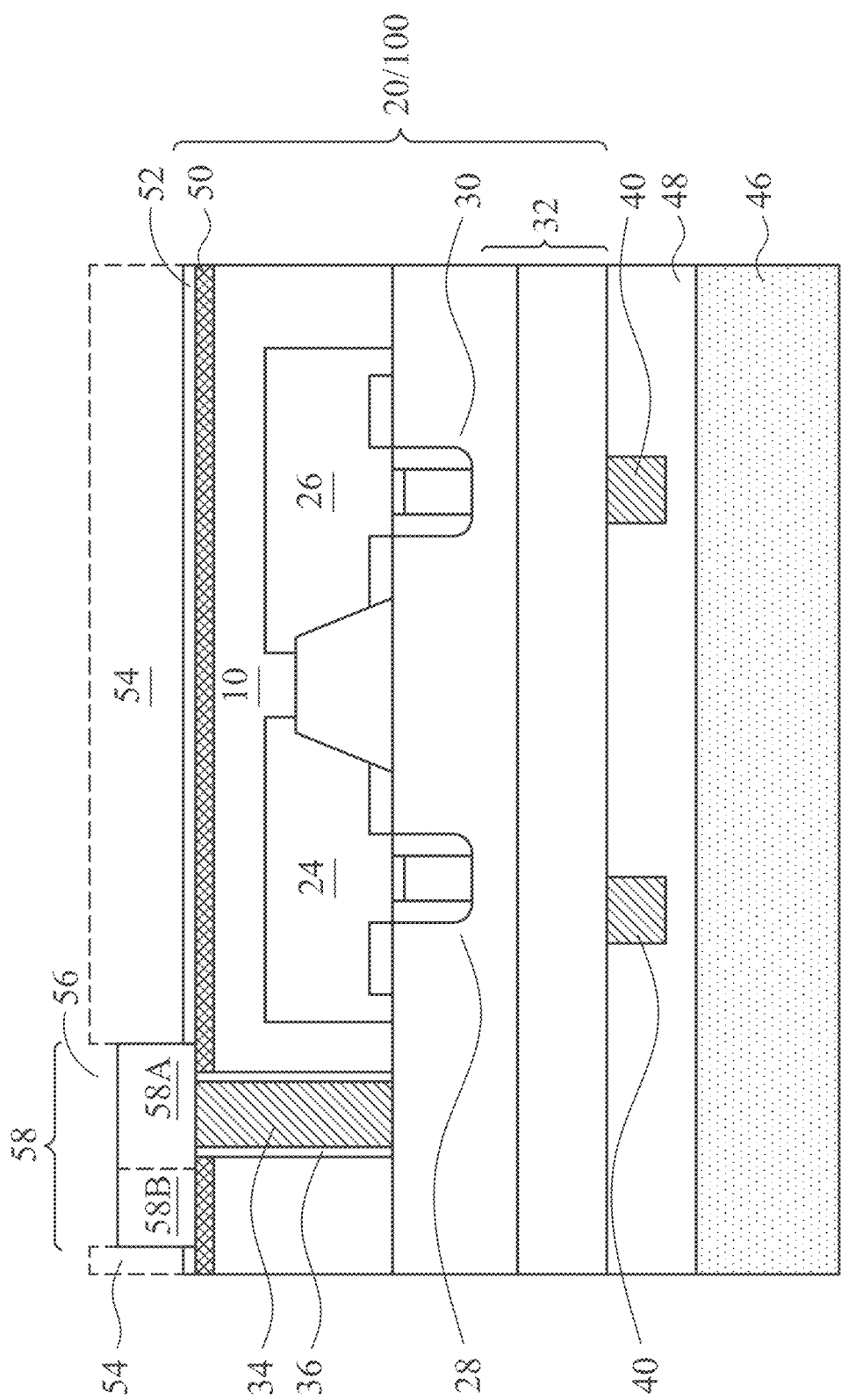

In FIG. 5, opening 56 is selectively filled with a metallic material, forming redistribution line (RDL) 58 in opening 56. In an embodiment, the filling material includes copper or copper alloys, although other metals, such as nickel, solder, aluminum, gold, multi-layers thereof, and combinations thereof, may also be used. The filling methods may include electro-chemical plating (ECP), electroless plating, or the like. Mask 54 is then removed. As a result, the portions of UBM 52 underlying mask 54 are exposed.

Figure 6:
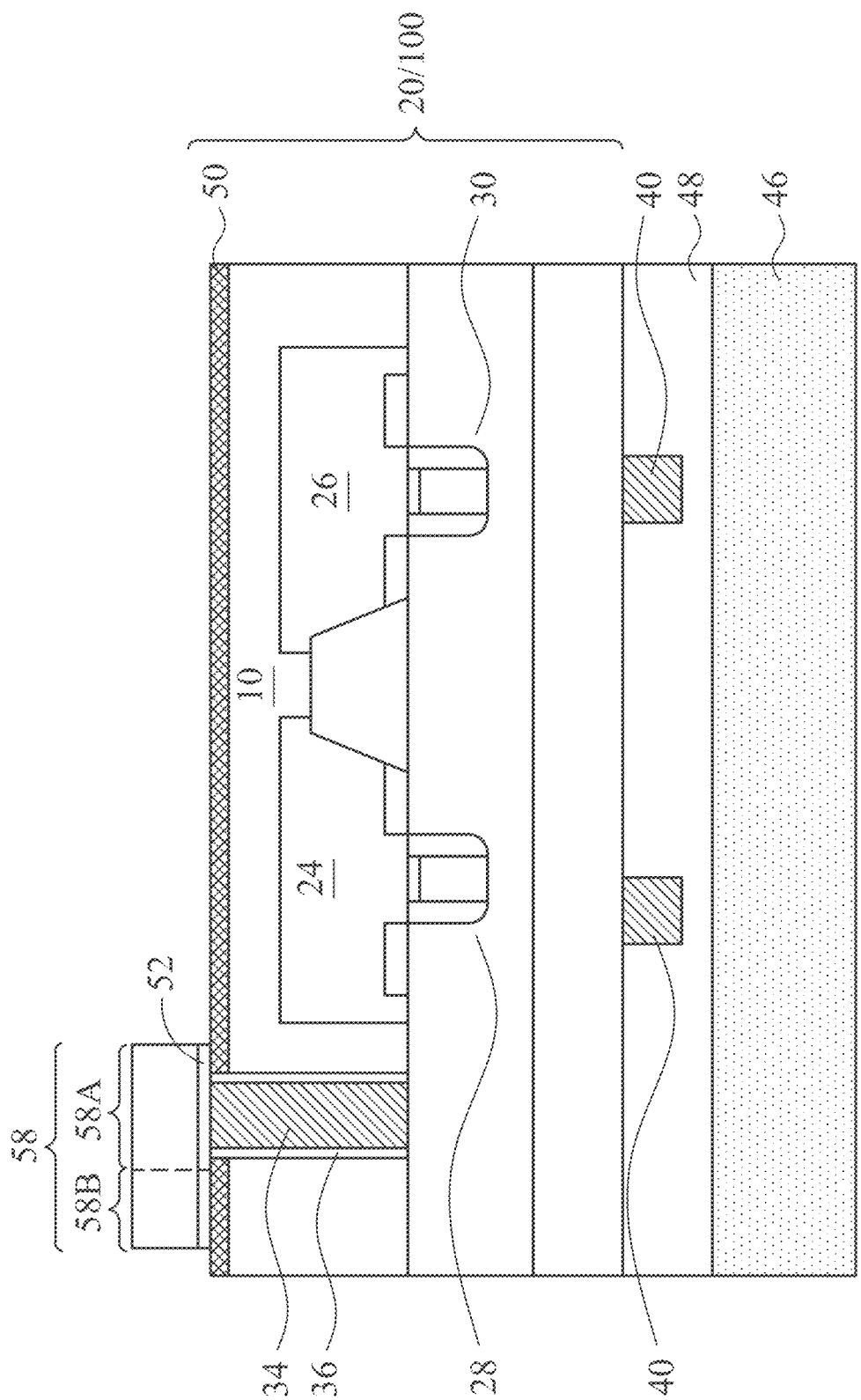
Figure 7:
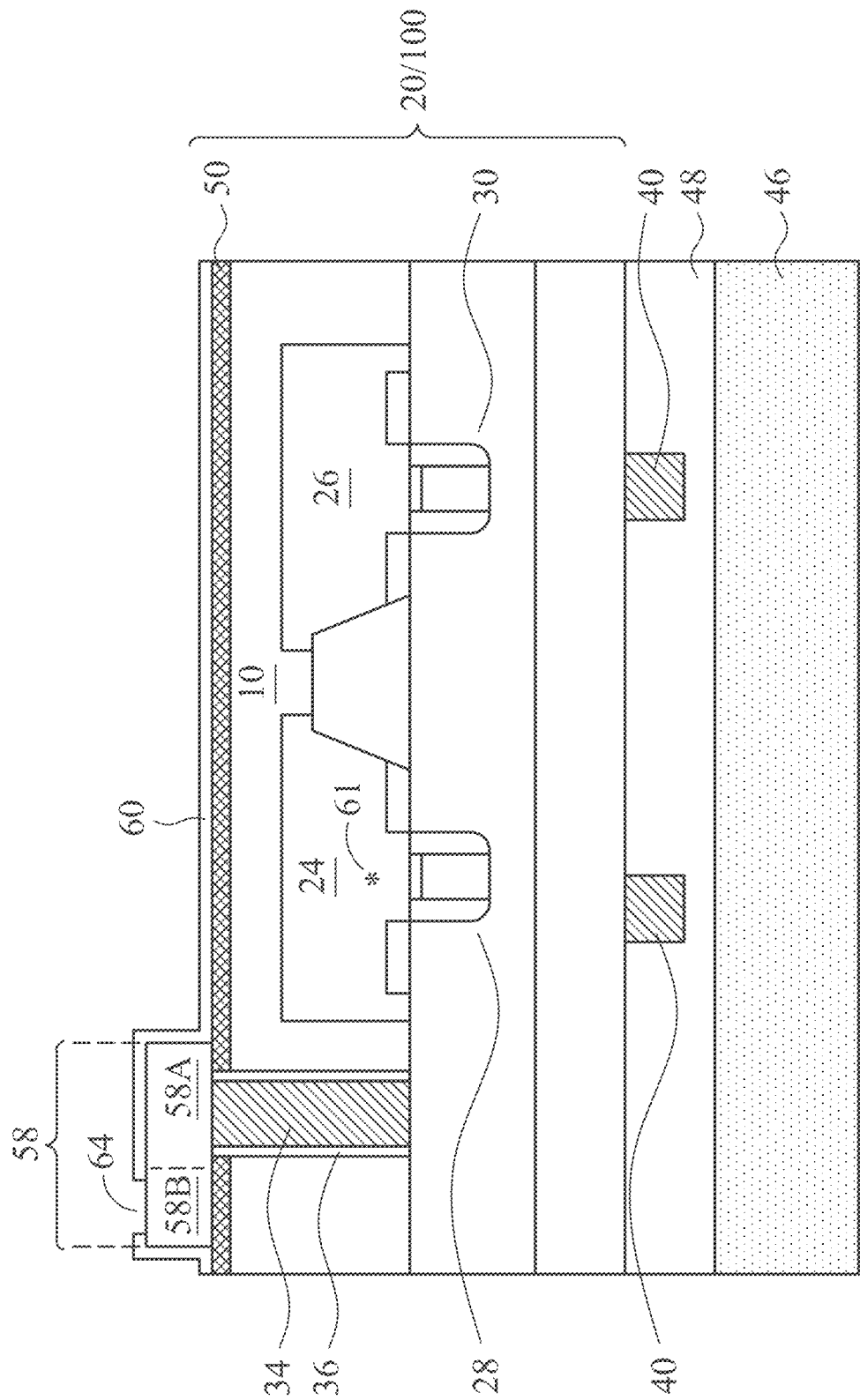

Referring to FIG. 6, the exposed portions of UBM 52 are removed by etching. The remaining RDL 58 may include RDL strip (also referred to as a redistribution trace) 52A that includes a portion directly over, and connected to, TSV 34, and optionally RDL pad 58B joining RDL strip 52A. In FIG. 7 and subsequent figures, UBM 52 is not shown since it may be formed of similar materials as RDL 58, and thus becomes a part of RDL 58.

Next, as shown in FIG. 7, passivation layer 60 is blanket formed and patterned to form opening 64. Passivation layer 56 may be formed of nitrides, oxides, and the like. A portion of RDL pad 58B is exposed through opening 64 in passivation layer 60. A center portion of RDL pad 58B is exposed through opening 64, while the edge portions of RDL pad 58B may be covered by passivation layer 60. RDL strip 52A may remain to be covered by passivation layer 60.

Figure 11:
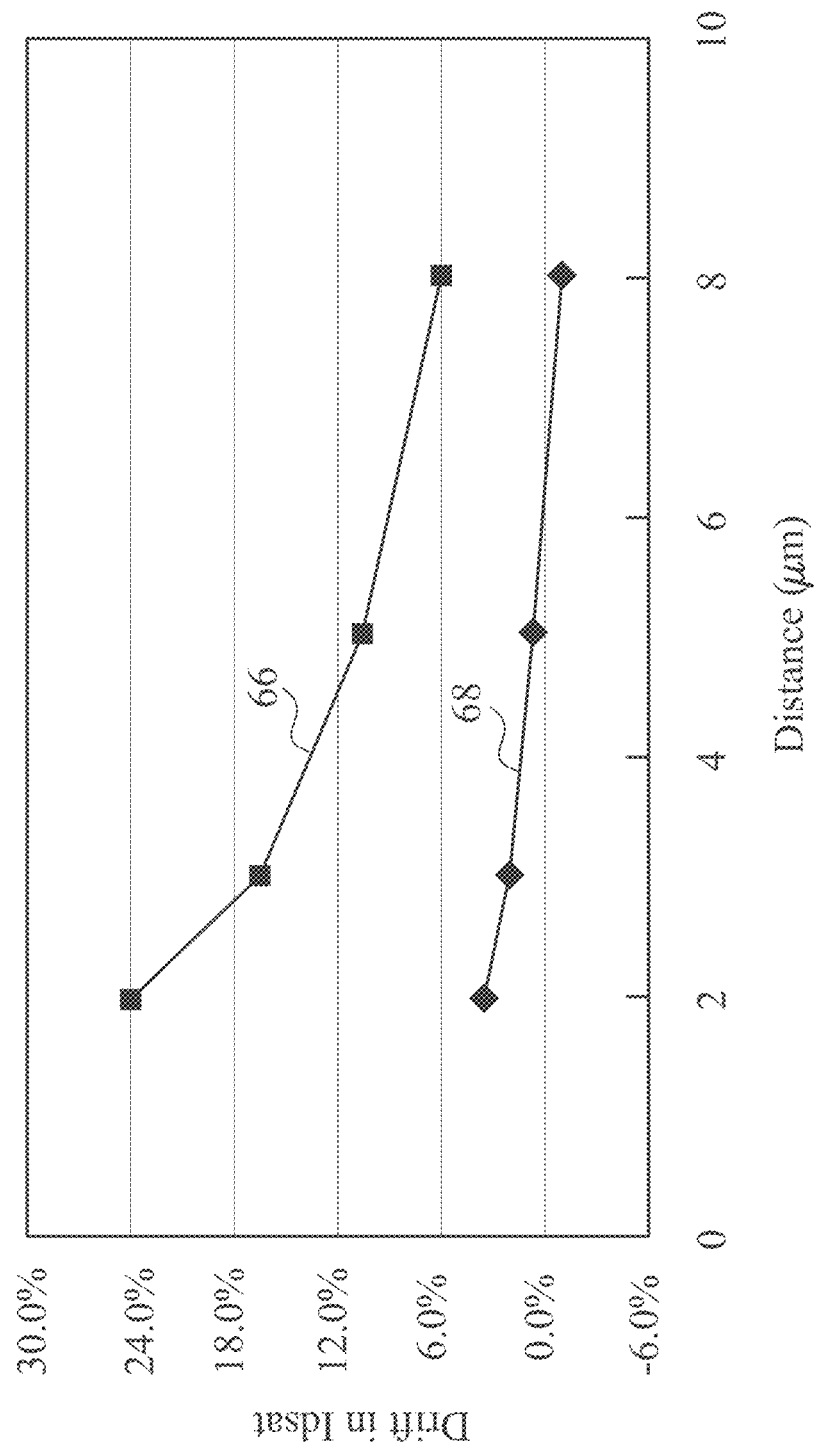
FIG. 11 illustrates the drift in saturation currents Idsat of PMOS devices as a function of distances between the PMOS devices and TSVs.

Due to the formation of TSV 34, a stress is generated and applied to substrate 10 by TSV 34. The stress causes the performance of PMOS device 28 and NMOS device 30 to drift as compared to if no TSV is formed in substrate 10. FIG. 11 illustrates the experiment results revealing the drift of the performance, wherein the experiment results are obtained by forming sample PMOS and NMOS devices and TSVs in first sample silicon wafers, and forming sample PMOS devices and NMOS devices on second sample silicon wafers, with no TSV formed in the second sample silicon wafers. The saturation currents (Idsat) of the PMOS devices in the first sample silicon wafers are compared to that of the PMOS devices in the second sample silicon wafers. The Y-axis represents the percentage of the drift in saturation currents Idsat of the PMOS devices in the first sample silicon wafers, wherein the drift is calculated using the saturation currents Idsat of the PMOS devices in the second sample silicon wafers as criteria. The X-axis represents the distance of the respective PMOS devices from the TSVs. Referring to line 66, when passivation layer 60 is a uniform layer, the drift in saturation currents Idsat ranges from 6 percent to 24 percent (line 66). Furthermore, it is observed that the effect of the TSV to the drift is not uniform, wherein the PMOS devices closer to the TSVs are affected more than the PMOS devices farther away from the TSVs. The non-uniform effect causes difficulty in the prediction of device performance, and difficulty in circuit design.

In an embodiment, passivation layer 60 is designed to have an inherent stress, and applies a stress to substrate 10. The performance of PMOS device 28 and NMOS device 30 are hence affected by the stress of passivation layer 60, and the performance drift of PMOS device 28 and NMOS device 30 may be reduced by adjusting the stress applied by passivation layer 60. In an embodiment, passivation layer 60 may apply a stress that compensates for the stress applied by TSVs, which means that the stress applied by passivation layer 60 neutralizes the stress applied by the TSVs. For example, if TSV 34 applies a tensile stress to substrate 10, passivation layer 60 applies a compressive stress to substrate 10. Conversely, if TSV 34 applies a compressive stress to substrate 10, passivation layer 60 applies a tensile stress to substrate 10. An equipment such as a Micro-Raman Spectrometer may be used to measure the stress applied to substrate 10 by TSV 34, and then passivation layer 60 may be formed to generate the stress that has substantially the same amplitude as, but has an inversed type than, the stress applied by TSV 34, so that the overall stress applied by TSV 34 and passivation layer 60 may be a neutral stress (no stress). In this embodiment, the neutral stress is also referred to as a target stress. In alternative embodiments, the stress generated by TSV 34 is measured from sample wafers different from production wafers such as wafer 100.

In alternative embodiments, instead of compensating for the stress caused by TSV, passivation layer 60 may also apply a stress that is of the same type as the stress generated by TSV 34. For example, if the stress applied to substrate 10 by TSV 34 is a tensile stress, passivation layer 60 also generates a tensile stress. Conversely, if the stress applied to substrate 10 by TSV 34 is a compressive stress, passivation layer 60 also generates a compressive stress. This may benefit one of PMOS device 28 and NMOS device 30, so that it has a greater drive current. The other one of PMOS device 28 and MOS device 30 is weakened. This embodiment may be used when one of PMOS device 28 and NMOS device needs to be improved in some applications.

Generally, in above-discussed embodiments, a desirable target stress applied by TSV 34 and passivation layer 60 in combination is pre-determined. The stress applied by TSV 34 is measured (from production wafers or sample wafers), and the difference between the pre-determined target stress and the stress applied by TSV 34 is made up by passivation layer 60. In the above-discussed embodiments, when the pre-determined target stress is a neutral stress (no stress), the stress applied by passivation layer 60 will fully compensate for the stress applied by TSV 34.

When using Micro-Raman Spectrometer or other equipment to measure the stress applied by TSV 34, the stress in substrate 10 may be measured at a selected location close to TSV 34, for example, with a distance between about 1 μm and about 10 μm from TSV 34, although different distances may be used. FIG. 7 schematically illustrate location 61, at which the desirable target stress is determined, and the stress applied by TSV 34 is measured.

Referring to FIG. 11, line 68 illustrates experiment result obtained from a sample wafer that includes passivation layer 60, which applies a stress compensating for the stress generated by TSV 34. It is observed that the performance drift, rather than ranging between about 6 percent and about 24 percent, only ranges between about −1 percent and about 3 percent. In addition to the significant reduction in the performance drift, it is also observed that the performance drift is more uniform, and for the distances (between the PMOS device and the TSVs) ranging from 2 μm and 8 μm, the difference in the performance drifts is only about 4 percent. Accordingly, passivation 60 may globally make the stress more uniform throughout the entire wafer 100. In alternative embodiments that the stresses applied by passivation layer 60 strengthens (rather than compensates for) the stress applied by TSV, the performance drifts of MOS devices are also more uniform.

The adjustment of the stress of passivation layer 60 may be achieved by selecting appropriate materials for passivation layer 60 and/or adjusting process conditions for depositing passivation layer 60. For example, in the embodiments wherein passivation layer 60 is formed of silicon nitride, the respective precursors may include silane and ammonia, and the formation method may be plasma enhance chemical vapor deposition (PECVD) or other applicable deposition methods. In an embodiment, adjusting the UV curing dosage to be greater may cause the stress applied by passivation layer 60 to be more tensile, while applying Argon bombardment may cause the stress applied by passivation layer 60 to be more compressive, and the stress of passivation layer 60 may be adjusted into the desirable range.

Figure 8:
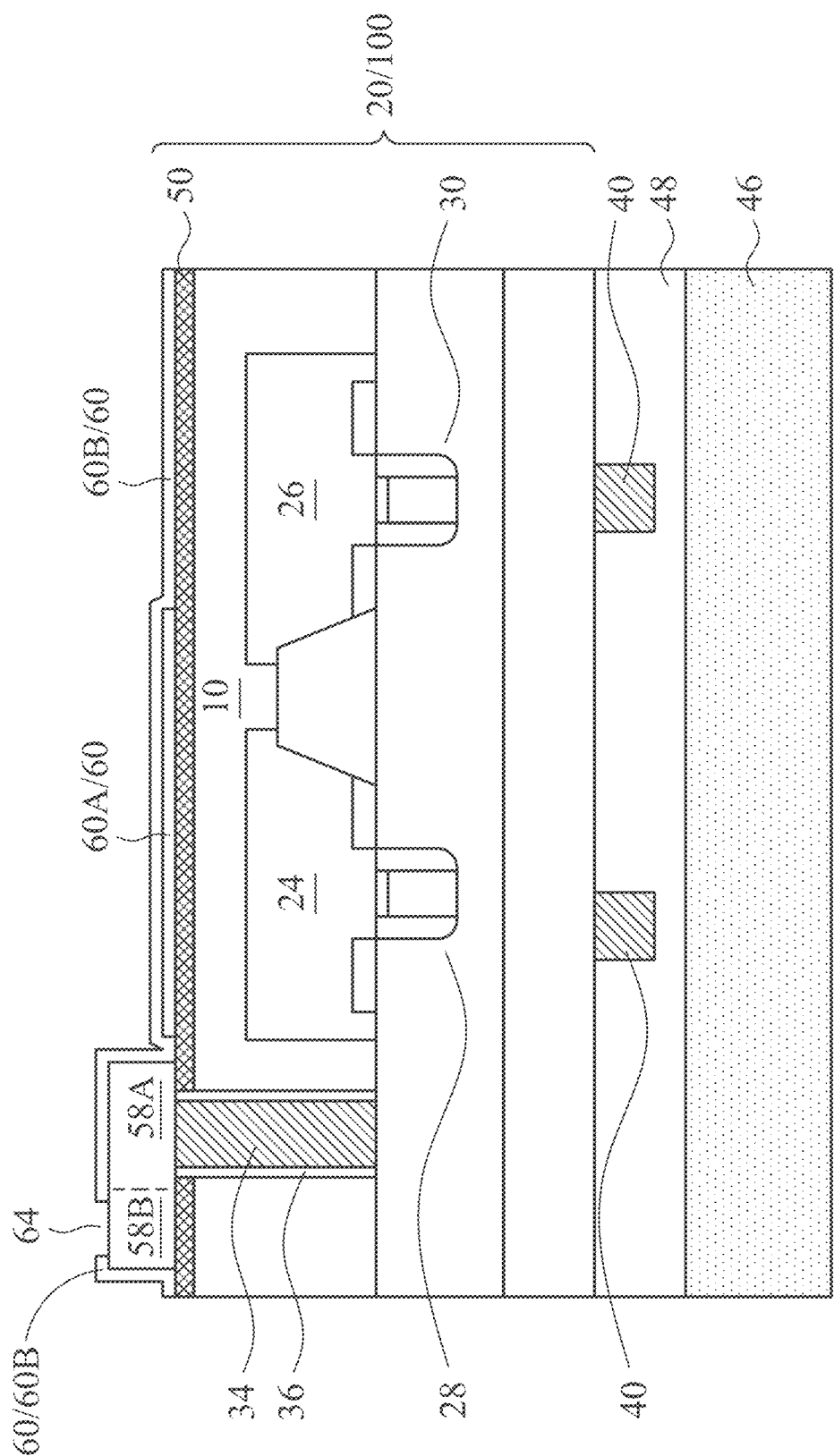
FIGS. 8 through 10 illustrate cross-sectional views of dies comprising backside interconnect structures in accordance with alternative embodiments.
Figure 9:
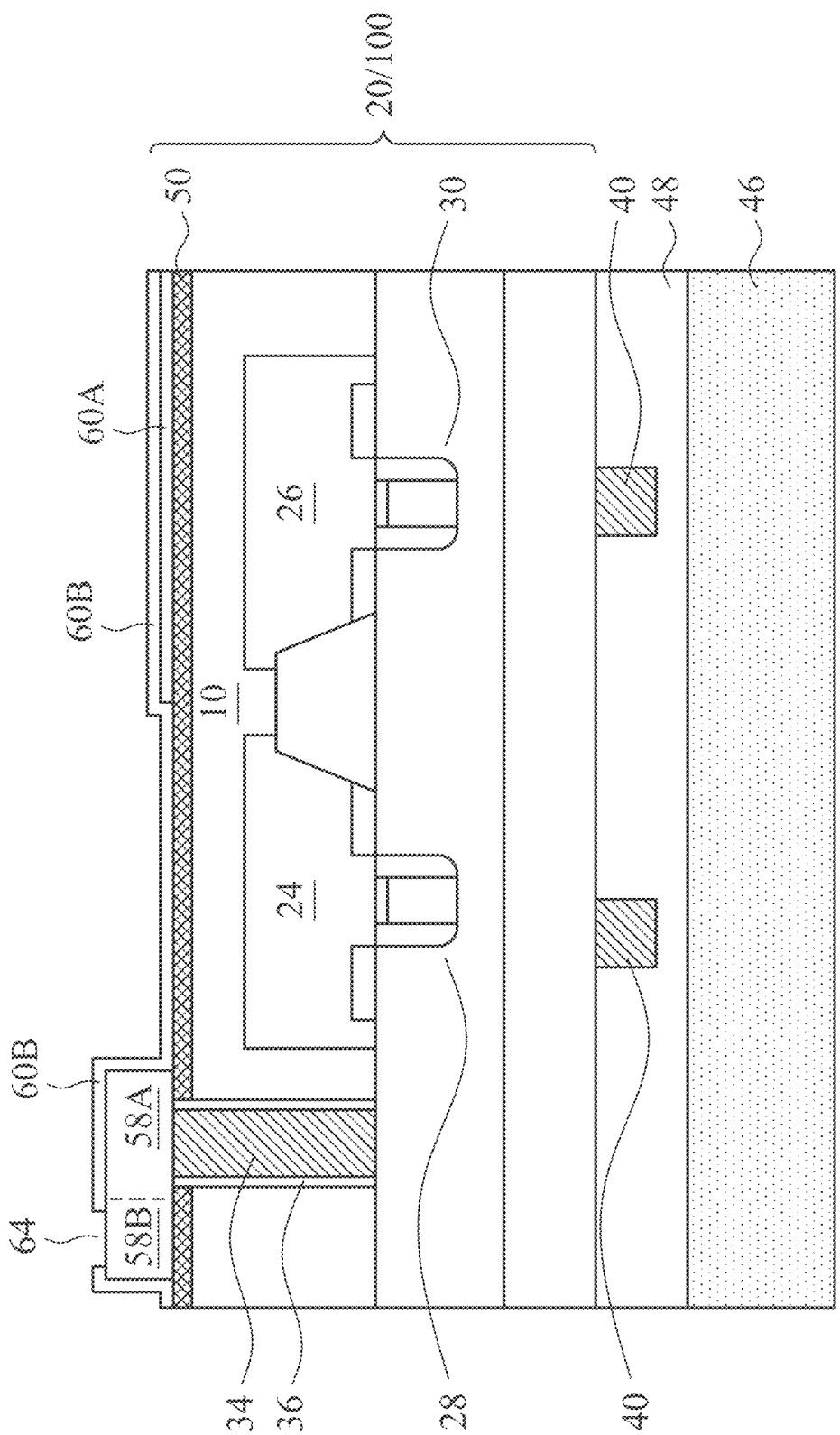
Figure 10:
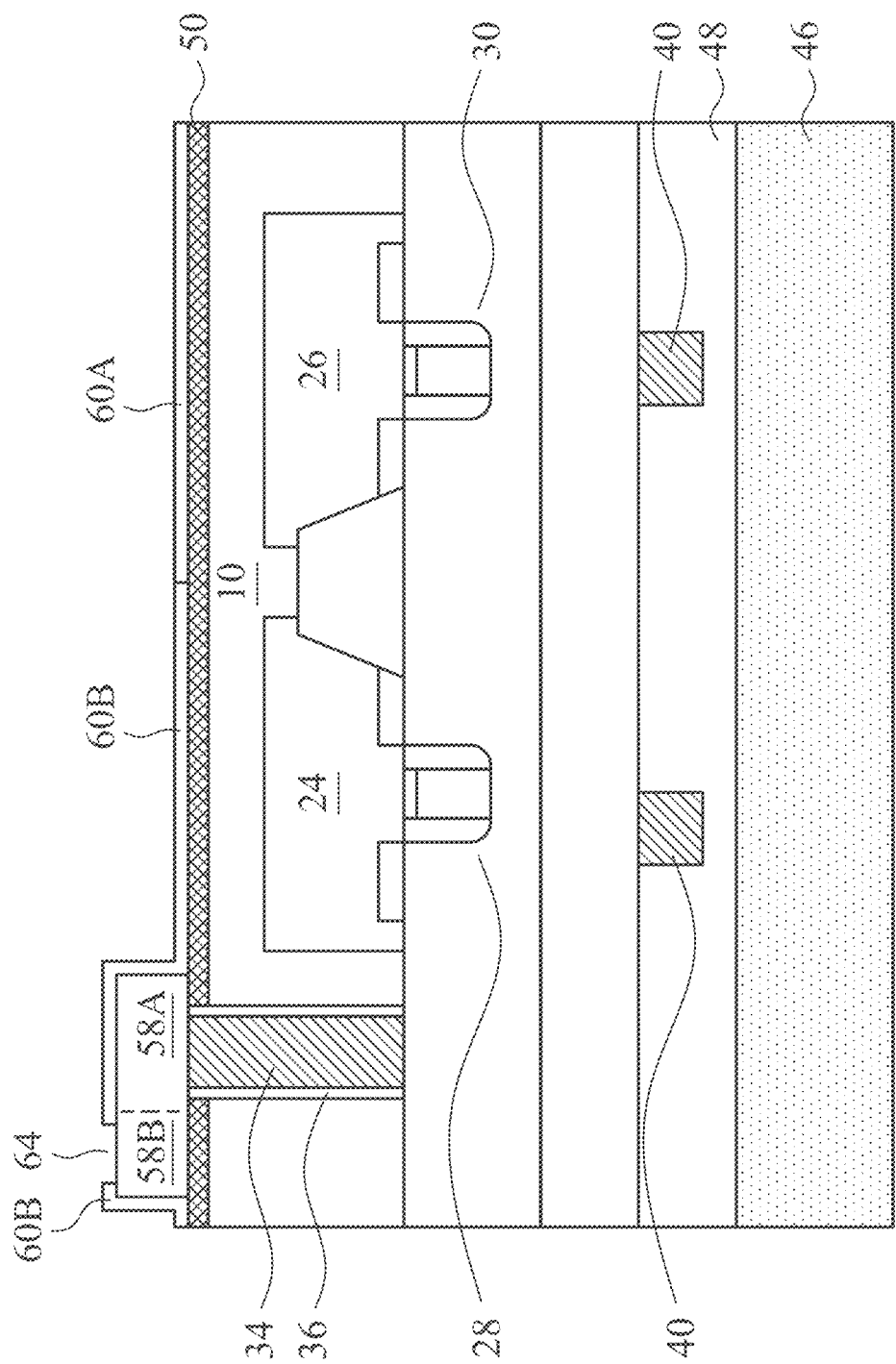

FIGS. 8-10 illustrate cross-sectional views of chip 20 in accordance with alternative embodiments. Unless specified otherwise, the reference numerals in these embodiments represent like elements in the embodiments illustrated in FIGS. 1 through 7. The initial steps of this embodiment are essentially the same as shown in FIGS. 1 through 6. Referring to FIG. 8, passivation layer 60, which is a composite layer, is formed. Passivation layer 60 includes sub-layer 60A and sub-layer 60B. In an embodiment, sub-layer 60A is formed overlying and vertically overlapping PMOS device 28 (which may represent substantially all PMOS devices in chip 20 or wafer 100), and may be formed overlying and vertically overlapping n-well region 24. Sub-layer 60A may not extend to overlying and vertically overlapping substantially any of NMOS device 30 or P-well region 26 in chip 20 or wafer 100. Sub-layer 60B may extend overlying and vertically overlapping substantially all PMOS devices 28 and NMOS devices 30 in chip 20 or wafer 100, and overlying and vertically overlapping substantially all n-well regions 24 and p-well regions 26, except where RDL pads 58B are exposed. In an embodiment, sub-layer 60A applies a compressive stress to substrate 10, and sub-layer 60B applies a tensile stress to substrate 10. Accordingly, the performance of NMOS device 30 is improved by passivation layer 60, while the performance of PMOS device 28 is affected less due to the formation of sub-layer 60A. The formation of sub-layers 60A and 60B include blanket forming sub-layers 60A, patterning sub-layers 60A, and then forming sub-layers 60B. The process conditions for forming sub-layers 60A and 60B may refer to the embodiment shown in FIG. 7.

In alternative embodiments, as shown in FIG. 9, sub-layer 60A is formed overlying and vertically overlapping NMOS device 30 (which may represent substantially all NMOS devices in chip 20 or wafer 100), and may be formed overlying and vertically overlapping p-well region 26. Sub-layer 60A may not extend to overlying and vertically overlapping any of PMOS devices 28 and n-well regions 24 in chip 20 or wafer 100. Sub-layer 60B may extend overlying and vertically overlapping substantially all PMOS devices 28 and NMOS devices 30, and overlying and vertically overlapping substantially all n-well regions 24 and p-well regions 26, except where RDL pads 58B are exposed. In these embodiments, sub-layer 60A may apply a tensile stress to substrate 10, and sub-layer 60B applies a compressive stress to substrate 10.

In yet other embodiments, as shown in FIG. 10, sub-layer 60A may be formed overlying and vertically overlapping NMOS device 30 (which may represent substantially all NMOS devices in chip 20 or wafer 100), and may be formed overlying and vertically overlapping p-well region 26. Sub-layer 60A may not extend to directly overlying and vertically overlapping PMOS device 28 and n-well region 24. Sub-layer 60B may be formed overlying and vertically overlapping PMOS device 28 (which may represent substantially all PMOS devices in chip 20 or wafer 100), and may be formed overlying and vertically overlapping n-well region 24. Sub-layer 60B may not extend to directly overlying and vertically overlapping NMOS device 30 and p-well region 26. In these embodiments, the target stress may be determined separately for PMOS devices and NMOS devices based on the desirable performance of the PMOS and NMOS devices, and then the stresses that are to be provided by sub-layers 60A and 60B are calculated, and sub-layers 60A and 60B are formed accordingly using selected materials and process conditions to provide the desirable target stresses.

In the embodiments, dielectric layer(s) on the backside of semiconductor are formed to compensate for the stress applied to devices applied by TSVs, and/or to improve the performance of one of PMOS devices and NMOS devices. The dielectric layer(s) may make the performance drift caused by TSVs more uniform.

In accordance with embodiments, a device includes a PMOS device and an NMOS device at a front surface of a semiconductor substrate. A first dielectric layer is disposed on a backside of the semiconductor substrate. The first dielectric layer applies a first stress of a first stress type to the semiconductor substrate, wherein the first dielectric layer is overlying the semiconductor substrate and vertically overlapping a first one of the PMOS device and the NMOS device, and is not vertically overlapping a second one of the PMOS device and the NMOS device. A second dielectric layer is disposed on the backside of the semiconductor substrate. The second dielectric layer applies a second stress to the semiconductor substrate, wherein the second stress is of a second stress type opposite to the first stress type. The second dielectric layer vertically overlaps a second one of the PMOS device and the NMOS device.

In accordance with other embodiments, a device includes a TSV extending from a back surface of the semiconductor substrate down to a front surface of the semiconductor substrate. A metal pad is disposed on a backside of the semiconductor substrate and electrically coupled to the TSV. A first dielectric layer is over the back surface of the semiconductor substrate, wherein the first dielectric layer applies a first stress of a first stress type to the semiconductor substrate. A second dielectric layer is over and contacting the first dielectric layer, wherein the second dielectric layer applies a second stress of a second stress type opposite the first stress type to the semiconductor substrate. One of the first and the second dielectric layers includes a portion over and vertically overlapping an edge portion of the metal pad, with a center portion of the metal pad exposed through an opening in the one of the first and the second dielectric layers.

In accordance with yet other embodiments, a method includes pre-determining a target stress at a selected location in a semiconductor substrate of a wafer, and forming a TSV in the semiconductor substrate. A first stress applied to the selected location by the TSV is found. A material and process conditions for forming a dielectric layer that applies a second stress to the semiconductor substrate are selected, wherein at the selected location, a combined stress of the first stress and a second stress is substantially equal to the target stress. The dielectric layer is formed on a backside of the semiconductor substrate using the material and the process conditions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   pre-determining a target stress at a selected location in a semiconductor substrate of a wafer;
   forming a through-substrate via (TSV) in the selected location;
   finding a first stress applied to the selected location by the TSV;
   selecting a material and process conditions for forming a dielectric layer that applies a second stress to the semiconductor substrate, wherein at the selected location, a combined stress of the first stress and a second stress is substantially equal to the target stress; and
   forming the dielectric layer on a backside of the semiconductor substrate using the material and the process conditions.

2. The method of claim 1, wherein the target stress is a substantially neutral stress.

3. The method of claim 1, wherein the forming the dielectric layer comprises:
   forming a first sub-layer on the backside of the semiconductor substrate;
   removing the first sub-layer from directly over substantially all p-type metal-oxide-semiconductor (PMOS) devices or substantially all n-type metal-oxide-semiconductor (NMOS) devices that are in the wafer; and
   forming a second sub-layer over remaining portions of the first sub-layer, wherein the first and the second sub-layers apply stresses that have opposite stress types to the semiconductor substrate.

4. The method of claim 3, wherein the first and the second sub-layers are formed of substantially a same material, and wherein process conditions for forming the first sub-layer are different from process conditions for forming the second sub-layer.

5. The method of claim 1, wherein the finding the first stress comprises a step selected from the group consisting essentially of:
   measuring the first stress at the selected location of the semiconductor substrate; and
   measuring the first stress from another sample wafer.

6. The method of claim 1, wherein the target stress is selected from the group consisting essentially of a compressive stress and a tensile stress.

7. The method of claim 1, wherein the dielectric layer comprises a nitride.

8. A method comprising:
   forming a through-substrate via (TSV) extending from a front surface of a semiconductor substrate of a wafer into the semiconductor substrate, wherein the wafer comprises a transistor at the front surface of the semiconductor substrate, wherein the semiconductor substrate comprises a back surface opposite to the front surface, and wherein the TSV applies a first stress to a nearby region of the semiconductor substrate, with the nearby region being adjacent to the TSV;
   performing a backside grinding on the back surface of the semiconductor substrate to expose the TSV;
   forming a backside isolation layer over and contacting the back surface, wherein the TSV is exposed through the backside isolation layer;
   forming a redistribution line on the backside of the semiconductor substrate, wherein the redistribution line is over the backside isolation layer; and
   forming a passivation layer comprising:
      a first portion over the redistribution line;
      a second portion on sidewalls of the redistribution line; and
      a third portion lower than the first portion and the second portion, wherein the passivation layer applies a second stress to the nearby region, with the second stress being of an opposite type than the first stress.

9. The method of claim 8, wherein in the nearby region, the first stress is substantially neutralized by the second stress.

10. The method of claim 8 further comprising:
    after the TSV is formed, measuring the first stress; and
    before the forming the passivation layer, selecting a material and process conditions for forming the passivation layer that applies the second stress to the nearby region.

11. The method of claim 10 further comprising:
    forming a sample wafer identical to the wafer;
    forming a sample TSV in the sample wafer; and
    after the sample TSV is formed on the sample wafer, measuring the first stress, wherein the first stress is equal to a stress applied by the sample TSV to the sample wafer.

12. The method of claim 8, wherein the passivation layer comprises a nitride.

13. A method comprising:
    forming a through-substrate via (TSV) extending from a front surface of a semiconductor substrate of a wafer into the semiconductor substrate, wherein the wafer comprises a transistor at the front surface of the semiconductor substrate, wherein the semiconductor substrate comprises a back surface opposite to the front surface, and wherein the TSV applies a first stress to a nearby region of the semiconductor substrate, with the nearby region being adjacent to the TSV;
    performing a backside grinding on the back surface of the semiconductor substrate to expose the TSV;
    forming a backside isolation layer over and contacting the back surface, wherein the TSV is exposed through the backside isolation layer;
    forming a redistribution line on the backside of the semiconductor substrate, wherein the redistribution line is over the backside isolation layer; and
    forming a passivation layer comprising:
       a first portion over the redistribution line;
       a second portion on sidewalls of the redistribution line; and
       a third portion lower than the first portion and the second portion, wherein the passivation layer applies a second stress to the nearby region, with the second stress being of a same type as the first stress.

14. The method of claim 13 further comprising:
    after the TSV is formed, measuring the first stress; and
    before the forming the passivation layer, selecting a material and process conditions for forming the passivation layer that applies the second stress to the semiconductor substrate.

15. The method of claim 13 further comprising:
 forming a sample wafer identical to the wafer;
 forming a sample TSV in the sample wafer; and
 after the sample TSV is formed on the sample wafer, measuring the first stress, wherein the first stress is equal to a stress applied by the sample TSV to the sample wafer.

16. The method of claim 13, wherein the step of forming the passivation layer comprises:
 forming a first sub-layer;
 removing the first sub-layer from directly over substantially all p-type metal-oxide-semiconductor (PMOS) devices or substantially all n-type metal-oxide-semiconductor (NMOS) devices that are in the wafer; and
 forming a second sub-layer over remaining portions of the first sub-layer.

17. The method of claim 13, wherein the passivation layer comprises a nitride.

* * * * *